US007150622B2

(12) United States Patent
Choi et al.

(10) Patent No.: US 7,150,622 B2
(45) Date of Patent: Dec. 19, 2006

(54) SYSTEMS FOR MAGNIFICATION AND DISTORTION CORRECTION FOR IMPRINT LITHOGRAPHY PROCESSES

(75) Inventors: Byung-Jin Choi, Round Rock, TX (US); Sidlgata V. Sreenivasan, Austin, TX (US); Mario J. Meissl, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 389 days.

(21) Appl. No.: 10/616,294

(22) Filed: Jul. 9, 2003

(65) Prior Publication Data

US 2005/0006343 A1 Jan. 13, 2005

(51) Int. Cl.
*B28B 11/08* (2006.01)

(52) U.S. Cl. .................. 425/385; 425/405.1; 425/470; 425/383; 425/385; 425/389; 425/390; 425/394; 425/395; 425/396; 425/397; 425/400; 425/403; 425/403.1; 249/155

(58) Field of Classification Search ..... 425/383–403.1, 425/405.1, 470; 249/155
See application file for complete search history.

(56) References Cited

U.S. PATENT DOCUMENTS

| | | | | |
|---|---|---|---|---|
| 3,783,520 | A | 1/1974 | King | |
| 4,256,829 | A | 3/1981 | Daniel | |
| 4,326,805 | A | 4/1982 | Feldman et al. | |
| 4,492,554 | A * | 1/1985 | Carter | 425/383 |
| 4,512,848 | A | 4/1985 | Deckman et al. | |
| 4,600,309 | A | 7/1986 | Fay | |
| 4,724,222 | A | 2/1988 | Feldman | |
| 4,731,155 | A | 3/1988 | Napoli et al. | |
| 4,848,911 | A | 7/1989 | Uchida et al. | |
| 4,929,083 | A | 5/1990 | Brunner | |
| 5,028,366 | A | 7/1991 | Harakal et al. | |
| 5,066,351 | A * | 11/1991 | Knoll | 156/212 |
| 5,072,126 | A | 12/1991 | Progler | |
| 5,074,667 | A | 12/1991 | Miyatake | |
| 5,148,036 | A | 9/1992 | Matsugu et al. | |
| 5,148,037 | A | 9/1992 | Suda et al. | |
| 5,151,242 | A * | 9/1992 | Soeda et al. | 264/572 |

(Continued)

FOREIGN PATENT DOCUMENTS

| | | |
|---|---|---|
| DE | 2800476 | 7/1978 |

(Continued)

OTHER PUBLICATIONS

Chou et al., "Imprint of Sub-25 nm Vias and Trenches in Polymers," Applied Physics Letters, Nov. 20, 1995, pp. 3114-3116, vol. 67(21).

(Continued)

*Primary Examiner*—Robert Davis
*Assistant Examiner*—G. Nagesh Rao
(74) *Attorney, Agent, or Firm*—Kenneth C. Brooks; Michael D. Carter

(57) ABSTRACT

The present invention is directed toward a system to vary dimensions of a template in order to attenuate if not prevent distortions in an underlying pattern formed by the template. To that end, the system features a compression device that includes a pair of spaced-apart contact members to compress a perimeter surface of the template between the pair of spaced-apart contact members. The compression device includes first and second bodies, each has a contact member and an actuator arm. One of the actuator arms is coupled to the first body to reciprocate about an axis in response to variations of a volume of a bladder disposed adjacent to the actuator arm. In this manner, the distance between the two contact members may be varied.

22 Claims, 12 Drawing Sheets

U.S. PATENT DOCUMENTS

| | | | | | |
|---|---|---|---|---|---|
| 5,152,949 | A * | 10/1992 | Leoni et al. | 264/257 |
| 5,204,739 | A | 4/1993 | Domenicali | |
| 5,206,983 | A | 5/1993 | Guckel et al. | |
| 5,414,514 | A | 5/1995 | Smith et al. | |
| 5,425,848 | A | 6/1995 | Haisma et al. | |
| 5,563,684 | A | 10/1996 | Stagaman | |
| 5,601,641 | A | 2/1997 | Stephens | |
| 5,633,505 | A | 5/1997 | Chung et al. | |
| 5,669,303 | A | 9/1997 | Maracas et al. | |
| 5,737,064 | A | 4/1998 | Inoue et al. | |
| 5,772,905 | A | 6/1998 | Chou | |
| 5,776,748 | A | 7/1998 | Singhvi et al. | |
| 5,802,914 | A | 9/1998 | Fassler et al. | |
| 5,808,742 | A | 9/1998 | Everett et al. | |
| 5,820,894 | A * | 10/1998 | Kreutzer | 425/389 |
| 5,849,209 | A | 12/1998 | Kindt-Larsen et al. | |
| 5,849,222 | A | 12/1998 | Jen et al. | |
| 5,877,036 | A | 3/1999 | Kawai | |
| 5,877,861 | A | 3/1999 | Ausschnitt et al. | |
| 5,900,160 | A | 5/1999 | Whitesides et al. | |
| 5,948,470 | A | 9/1999 | Harrison et al. | |
| 5,999,245 | A | 12/1999 | Suzuki | |
| 6,019,166 | A | 2/2000 | Viswanath et al. | |
| 6,039,897 | A | 3/2000 | Lochhead et al. | |
| 6,049,373 | A | 4/2000 | Miyatake | |
| 6,088,103 | A | 7/2000 | Everett et al. | |
| 6,128,085 | A | 10/2000 | Buermann et al. | |
| 6,137,562 | A | 10/2000 | Masuyuki et al. | |
| 6,150,231 | A | 11/2000 | Muller et al. | |
| 6,180,239 | B1 | 1/2001 | Whitesides et al. | |
| 6,285,439 | B1 | 9/2001 | Miyatake | |
| 6,295,120 | B1 | 9/2001 | Miyatake | |
| 6,309,580 | B1 | 10/2001 | Chou | |
| 6,334,960 | B1 | 1/2002 | Willson et al. | |
| 6,355,198 | B1 | 3/2002 | Kim et al. | |
| 6,383,888 | B1 | 5/2002 | Stirton | |
| 6,388,755 | B1 | 5/2002 | Zhao | |
| 6,391,217 | B1 | 5/2002 | Schaffer et al. | |
| 6,482,741 | B1 * | 11/2002 | Ueno | 438/687 |
| 6,482,742 | B1 | 11/2002 | Chou | |
| 6,489,068 | B1 | 12/2002 | Kye | |
| 6,517,995 | B1 | 2/2003 | Jacobson et al. | |
| 6,518,168 | B1 | 2/2003 | Clem et al. | |
| 6,518,189 | B1 | 2/2003 | Chou | |
| 6,522,411 | B1 | 2/2003 | Moon et al. | |
| 6,580,172 | B1 | 6/2003 | Mancini et al. | |
| 6,630,410 | B1 | 10/2003 | Trapp et al. | |
| 6,636,311 | B1 | 10/2003 | Ina et al. | |
| 6,646,662 | B1 | 11/2003 | Nebashi et al. | |
| 6,665,119 | B1 | 12/2003 | Kurtz et al. | |
| 6,696,220 | B1 | 2/2004 | Bailey et al. | |
| 6,713,238 | B1 | 3/2004 | Chou et al. | |
| 6,770,852 | B1 | 8/2004 | Stegner | |
| 6,776,094 | B1 | 8/2004 | Whitesides et al. | |
| 6,791,669 | B1 | 9/2004 | Poon | |
| 6,796,784 | B1 * | 9/2004 | Andre | 425/195 |
| 6,809,356 | B1 | 10/2004 | Chou | |
| 6,828,244 | B1 | 12/2004 | Chou | |
| 6,900,881 | B1 | 5/2005 | Sreenivasan et al. | |
| 6,908,861 | B1 | 6/2005 | Sreenivasan et al. | |
| 6,916,584 | B1 | 7/2005 | Sreenivasan et al. | |
| 6,916,585 | B1 | 7/2005 | Sreenivasan et al. | |
| 6,919,152 | B1 | 7/2005 | Sreenivasan et al. | |
| 6,929,762 | B1 | 8/2005 | Rubin | |
| 2002/0018190 | A1 | 2/2002 | Nogawa et al. | |
| 2002/0042027 | A1 | 4/2002 | Chou et al. | |
| 2002/0132482 | A1 | 9/2002 | Chou | |
| 2002/0150398 | A1 | 10/2002 | Choi et al. | |
| 2002/0167117 | A1 | 11/2002 | Chou | |
| 2002/0177319 | A1 | 11/2002 | Chou | |
| 2003/0034329 | A1 | 2/2003 | Chou | |
| 2003/0062334 | A1 | 4/2003 | Lee et al. | |
| 2003/0080471 | A1 | 5/2003 | Chou | |
| 2003/0080472 | A1 | 5/2003 | Chou | |
| 2003/0081193 | A1 | 5/2003 | White et al. | |
| 2003/0092261 | A1 | 5/2003 | Kondo et al. | |
| 2003/0179354 | A1 | 9/2003 | Araki et al. | |
| 2004/0007799 | A1 | 1/2004 | Choi et al. | |
| 2004/0008334 | A1 | 1/2004 | Sreenivasan et al. | |
| 2004/0009673 | A1 | 1/2004 | Sreenivasan et al. | |
| 2004/0021254 | A1 | 2/2004 | Sreenivasan et al. | |
| 2004/0021866 | A1 | 2/2004 | Watts et al. | |
| 2004/0022888 | A1 | 2/2004 | Sreenivasan et al. | |
| 2004/0033515 | A1 | 2/2004 | Cao et al. | |
| 2004/0036201 | A1 | 2/2004 | Chou et al. | |
| 2004/0046288 | A1 | 3/2004 | Chou | |
| 2004/0053146 | A1 | 3/2004 | Sreenivasan et al. | |
| 2004/0086793 | A1 | 5/2004 | Sreenivasan et al. | |
| 2004/0089979 | A1 | 5/2004 | Rubin | |
| 2004/0110856 | A1 | 6/2004 | Young et al. | |
| 2004/0112861 | A1 | 6/2004 | Choi et al. | |
| 2004/0118809 | A1 | 6/2004 | Chou et al. | |
| 2004/0124566 | A1 | 7/2004 | Sreenivasan et al. | |
| 2004/0131718 | A1 | 7/2004 | Chou et al. | |
| 2004/0137734 | A1 | 7/2004 | Chou et al. | |
| 2004/0156108 | A1 | 8/2004 | Chou et al. | |
| 2004/0192041 | A1 | 9/2004 | Jeong et al. | |
| 2004/0197843 | A1 | 10/2004 | Chou et al. | |
| 2004/0223131 | A1 | 11/2004 | Choi et al. | |
| 2004/0250945 | A1 | 12/2004 | Zheng et al. | |
| 2005/0037143 | A1 | 2/2005 | Chou et al. | |

FOREIGN PATENT DOCUMENTS

| | | |
|---|---|---|
| JP | 1-196749 | 8/1989 |
| JP | 02-24848 | 1/1990 |
| JP | 02-92603 | 4/1990 |
| WO | WO 99/05724 | 2/1999 |
| WO | WO 00/21689 | 4/2000 |
| WO | WO 00/62993 | 10/2000 |
| WO | WO 01/47003 | 6/2001 |
| WO | WO 01/79933 | 10/2001 |
| WO | WOX 01/79592 | 10/2001 |
| WO | WO 01/90816 | 11/2001 |
| WO | WO 02/07199 | 1/2002 |
| WO | WO 03/010289 | 2/2003 |
| WO | WO 03/079416 | 9/2003 |
| WO | WO 03/099536 | 12/2003 |
| WO | WO 2004/114016 | 12/2004 |

OTHER PUBLICATIONS

Chou et al., “Imprint Lithography with 25-Nanometer Resolution,” Science, Apr. 5, 1996, pp. 85-87, vol. 272.

Haisma et al., “Mold-Assisted Nanolithography: A Process for Reliable Pattern Replication,” Journal of Vacuum Science and Technology, Nov./Dec. 1996, pp. 4124-4128, vol. B 14(6).

Chou et al., “Imprint Lithography with Sub-10nm Feature Size and High Throughput,” Microelectronic Engineering, 1997, pp. 237-240, vol. 35.

Feldman et al., “Wafer chuck for manification correction in x-ray lithography,” American Vacuum Society, 1998, pp. 3476-3479.

Scheer et al., “Problems of the Nanoimprinting Technique for Nanometer Scale Pattern Definition,” Journal of Vacuum Science and Technology, Nov./Dec. 1998, pp. 3917-3921, vol. B 16(6).

Colburn. et al., “Step and Flash Imprint Lithography: A New Approach to High-Resolution Patterning”, Proc. of SPIE, 1999, pp. 379-389, vol. 3676.

Chou et al., “Lithographically-Induced Self Assembly of Periodic Polymer Micropillar Arrays,” Journal of Vacuum Science and Technology, Nov./Dec. 1999, pp. 3197-3202, vol. B 17(6).

Ruchhoeft et al., “Patterning Curved Surfaces: Template Generation by Ion Beam Proximity Lithography and Relief Transfer by Step and Flash Imprint Lithography,” Journal of Vacuum Science and Technology, 1999, pp. 2965-2982, vol. 17.

Choi et al., "Design of Orientation Stages for Step and Flash Imprint Lithography," Precision Engineering, Journal of the International Societies for Precision Engineering and Nanotechnology, 2001, pp. 192-199, vol. 25.

Chou, "Nanoimprint Lithography and Lithographically Induced Self-Assembly," MRS Bulletin, Jul. 2001, pp. 512-517.

Choi et al., "High Precision Orientation Alignment and Gap Control Stages for Imprint Lithography Processes," U.S. Appl. No. 09/698,317, Filed with USPTO on Oct. 27, 2000.

Sreenivasan et al., "High-Resolution Overlay Alignment Methods and Systems for Imprint Lithography," U.S. Appl. No. 09/907,512, Filed with USPTO on Jul. 16, 2001.

Nimmakayala et al., "Magnification Correction Employing Out-of-Plane Distortion of a Substrate," U.S. Appl. No. 10,735,110, Filed with USPTO on Dec. 12, 2003.

Park et al., Aligning Liquid Crystals Using Replicated Nanopatterns, PSI Scientific Report 2002, vol. VII, p. 85 Mar. 3, 2003.

U.S. Appl. No. 11/126,946, naming Inventors Choi et al., entitled Formation of Discontinuous Films During an Imprint Lithography Process, filed May 11, 2005.

U.S. Appl. No. 11/127,041, naming Inventors Sreenivasan et al., entitled Step and Repeat Imprint Lithography Processes, filed May 11, 2005.

U.S. Appl. No. 11/127,060, naming Inventors Sreenivasan et al., entitled Step and Repeat Imprint Lithography Systems, filed May 11, 2005.

U.S. Appl. No. 11/142,808, naming Inventors Cherala et al., entitled System for Varying Dimensions of a Substrate during Nano-Scale Manufacturing, filed Jun. 1, 2005.

U.S. Appl. No. 11/142,834, naming Inventors Cherala et al., entitled Method of Varying Dimensions of a Substrate during Nano-Scale Manufacturing, filed Jun. 1, 2005.

U.S. Appl. No. 11/142,839, naming Inventors Cherala et al., entitled Apparatusa to Vary Dimensions of a Substrate during Nano-Scale Manufacturing, filed Jun. 1, 2005.

U.S. Appl. No. 10/999,898, filed Nov. 30, 2004, Cherala et al.

Colburn et al., Step and Flash Imprint Lithography for sub-100 nm Patterning, Proceedings of SPIE vol. 3997, pp. 453-457, Jan. 1, 2000.

Chou et al., Imprint Lithography with Sub-10 nm Feature Size and High Throughput, Microelectronic Engineering 35, pp. 237-240, Jan. 1, 1997.

Johnson et al., Advances in Step and Flash Imprint Lithography, SPIE Microlithography Conference, Feb. 23, 2003.

Heidari, Nanoimprint Lithography at the 6 in. Wafer Scale, J. Vac. Sci. Technol. B 18(6), pp. 3557-3560, Nov. 1, 2000.

White et al., Novel Alignmnt System for Imprint Lithography, J. Vac. Sci. Technol. B 18(6), pp. 3552-3556, Nov. 1, 2000.

Translation of Japanese Patent 02-92603.

Translation of Japanese Patent 02-24848.

Chou et al., Ultrafast and Direct Imprint of Nanostructures in Silicon, Nature, Col. 417, (Jun. 2002), pp. 835-837, Jun. 1, 2002.

Chou et al., Nanoimprint Lithography, Journal of Vacuum Science Technolgoy B 14(16), pp. 4129-4133, Nov. 1, 1996.

Colburn et al., Development and Advantages of Step-and-Flash Lithography, Solid State Technology, Jul. 1, 2001.

Colburn et al., Characterization and Modeling of Volumetric and Mechanical Properties for Step and Flash Imprint Lithography Photopolymers, Journal of Vacuum Science Technology, vol. b. 19(6), Nov. 1, 2002.

Bailey et al., Step and Flash Imprint Lithography: Defect Analysis, Journal of Vacuum Science, B 19(6), pp. 2806-2810, Nov. 1, 2001.

Bailey et al., Step and Flash Imprint Lithography: Template Surface Treatment and Defect Analysis, Journal of Vacuum Science, B 18(6), pp. 3572-3577, Nov. 1, 2000.

Wronosky et al., Wafer and Reticle Positioning System for the Extreme Ultaviolet Lithography Engineering Test Stand, Emerging Lithography Technologies, Proceedings of SPIE vol. 3997, pp. 829-839, Jul. 1, 2000.

Schneider et al., Stripes of Partially Fluorinated Alkyl Chains: Dipolar Langmuir Monolayers.

Martin et al., Predication of Fabrication Distortions in Step and Flash Imprint Lithography Templates, Journal of Vacuum Science Technology B 20(6), pp. 2891-2895, Nov. 1, 2002.

* cited by examiner

SYSTEMS FOR MAGNIFICATION AND DISTORTION CORRECTION FOR IMPRINT LITHOGRAPHY PROCESSES

BACKGROUND OF THE INVENTION

The field of invention relates generally to imprint lithography. More particularly, the present invention is directed to reducing pattern distortions during imprint lithography processes.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

An exemplary micro-fabrication technique is shown in U.S. Pat. No. 6,334,960 to Willson et al. Willson et al. disclose a method of forming a relief image in a structure. The method includes providing a substrate having a transfer layer. The transfer layer is covered with a polymerizable fluid composition. A mold makes mechanical contact with the polymerizable fluid. The mold includes a relief structure, and the polymerizable fluid composition fills the relief structure. The polymerizable fluid composition is then subjected to conditions to solidify and polymerize the same, forming a solidified polymeric material on the transfer layer that contains a relief structure complimentary to that of the mold. The mold is then separated from the solid polymeric material such that a replica of the relief structure in the mold is formed in the solidified polymeric material. The transfer layer and the solidified polymeric material are subjected to an environment to selectively etch the transfer layer relative to the solidified polymeric material such that a relief image is formed in the transfer layer. The time required and the minimum feature dimension provided by this technique is dependent upon, inter alia, the composition of the polymerizable material.

U.S. Pat. No. 5,772,905 to Chou discloses a lithographic method and apparatus for creating ultra-fine (sub-25 nm) patterns in a thin film coated on a substrate in which a mold having at least one protruding feature is pressed into a thin film carried on a substrate. The protruding feature in the mold creates a recess of the thin film. The mold is removed from the film. The thin film then is processed such that the thin film in the recess is removed exposing the underlying substrate. Thus, patterns in the mold are replaced in the thin film, completing the lithography. The patterns in the thin film will be, in subsequent processes, reproduced in the substrate or in another material which is added onto the substrate.

Yet another imprint lithography technique is disclosed by Chou et al. in Ultrafast and Direct Imprint of Nanostructures in Silicon, Nature, Col. 417, pp. 835–837, June 2002, which is referred to as a laser assisted direct imprinting (LADI) process. In this process a region of a substrate is made flowable, e.g., liquefied, by heating the region with the laser. After the region has reached a desired viscosity, a mold, having a pattern thereon, is placed in contact with the region. The flowable region conforms to the profile of the pattern and is then cooled, solidifying the pattern into the substrate. A concern with these processes concerns distortions in the pattern resulting from, inter alia, extenuative variations in the imprinting layer and/or the substrate.

It is desired, therefore, to provide a system to reduce distortions in patterns formed using imprint lithographic techniques.

SUMMARY OF THE INVENTION

The present invention is directed toward a system to vary dimensions of a template in order to attenuate, if not prevent, distortions in an underlying pattern formed by the template. To that end, the system features a compression device that includes a pair of spaced-apart contact members to compress a perimeter surface of the template between the pair of spaced-apart contact members. One embodiment of the compression device includes first and second bodies, each has a contact member, defining a pair contact members. The contact members are disposed opposite to each other and spaced apart a distance. The first body includes an actuator arm, and a chamber disposed adjacent to the actuator arm. One of the pair of contact members is coupled to the actuator arm to move in response to movement of the actuator arm, varying the distance from the remaining contact member. A bladder is positioned within the chamber and has a variable volume. The actuator arm is coupled to the first body to move in response to variations of the volume to vary the distance. In one example, a fluid, such as a gas, selectively ingresses and egresses from the bladder to vary the volume of the same.

Use of a bladder facilitates conformation of the bladder with the actuator arm. In this manner, non-uniform force distribution on the actuator arm due, for example, to actuator surface imperfections, is avoided. In a similar manner, non-uniform force distribution on the template due, for example, to perimeter surface imperfections, may be avoided by forming one or more of the contact members from compliant material. Reducing, if not avoiding, non-uniform force distributions on the actuator arm and the perimeter surface provides more control and/or higher resolution of dimensional variation of the template. These and other embodiments are discussed more fully below.

DETAILED DESCRIPTION OF THE INVENTION

Figure 1:
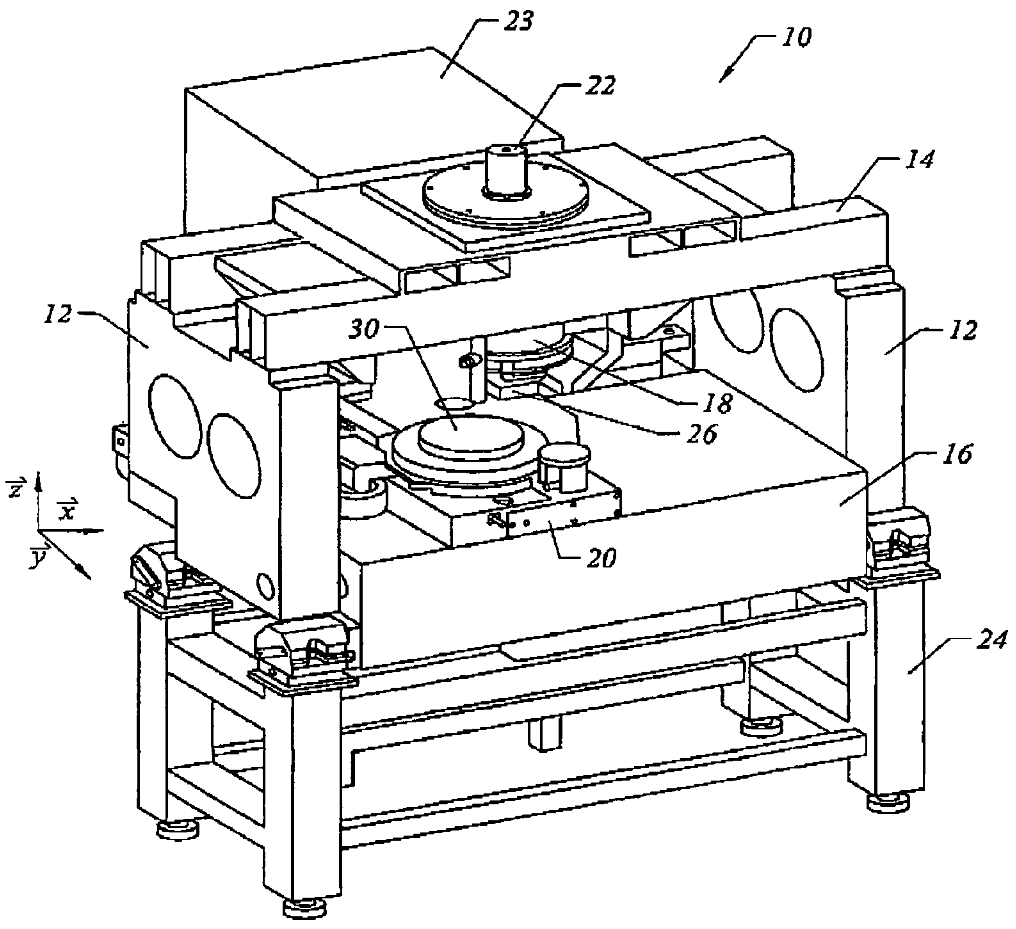
FIG. 1 is a perspective view of a lithographic system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16. Disposed upon stage support 16 to face imprint head 18 is a motion stage 20. Motion stage 20 is configured to move with respect to stage support 16 along X and Y axes. An exemplary motion stage device is disclosed in U.S. patent application Ser. No. 10/194,414, filed Jul. 11, 2002, entitled "Step and Repeat Imprint Lithography Systems", assigned to the assignee of the present invention, and which is incorporated by reference herein in its entirety. A radiation source 22 is coupled to system 10 to impinge actinic radiation upon motion stage 20. As shown, radiation source 22 is coupled to bridge 14 and includes a power generator 23 connected to radiation source 22.

Figure 2:
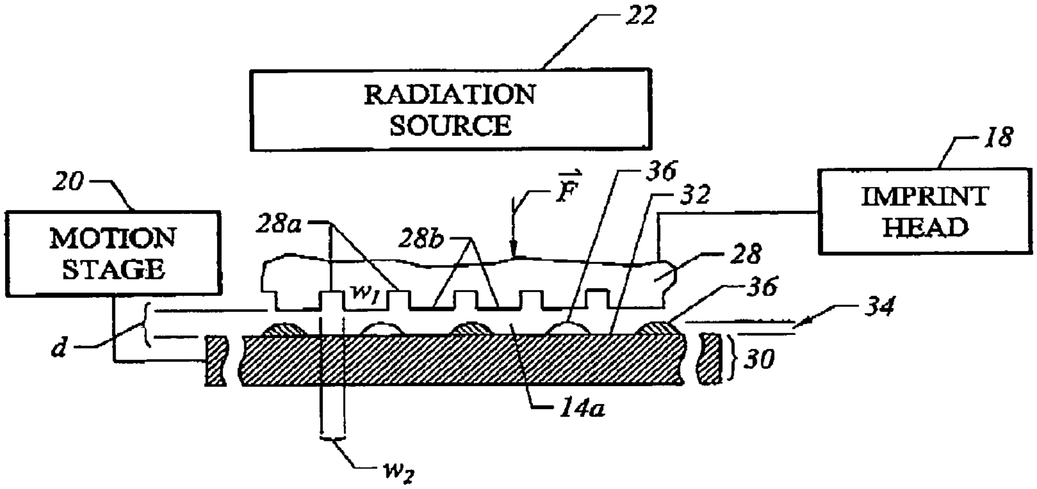
FIG. 2 is a simplified elevation view of a lithographic system shown in FIG. 1.

Referring to both FIGS. 1 and 2, connected to imprint head 18 is a template 26 having a mold 28 thereon. Mold 28 includes a plurality of features defined by a plurality of spaced-apart recessions 28*a* and protrusions 28*b*. The plurality of features defines an original pattern that is to be transferred into a wafer 30 positioned on motion stage 20. To that end, imprint head 18 is adapted to move along the Z axis and vary a distance "d" between mold 28 and wafer 30. In this manner, the features on mold 28 may be imprinted into a flowable region of wafer 30, discussed more fully below. Radiation source 22 is located so that mold 28 is positioned between radiation source 22 and wafer 30. As a result, mold 28 is fabricated from material that allows it to be substantially transparent to the radiation produced by radiation source 22.

Figure 3:
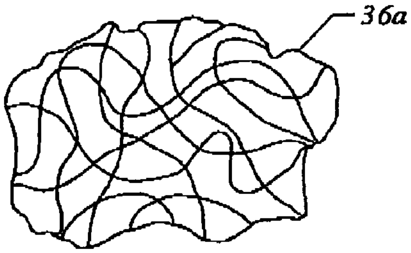
FIG. 3 is a simplified representation of material from which an imprinting layer, shown in FIG. 2, is comprised before being polymerized and cross-linked.

Referring to both FIGS. 2 and 3, a flowable region, such as an imprinting layer 34, is disposed on a portion of surface 32 that presents a substantially planar profile. Flowable region may be formed using any known technique such as a hot embossing process disclosed in U.S. Pat. No. 5,772,905, which is incorporated by reference in its entirety herein, or a laser assisted direct imprinting (LADI) process of the type described by Chou et al. in *Ultrafast and Direct Imprint of Nanostructures in Silicon*, Nature, Col. 417, pp. 835–837, June 2002. In the present embodiment, however, flowable region consists of imprinting layer 34 being deposited as a plurality of spaced-apart discrete beads 36 of material 36*a* on wafer 30, discussed more fully below. An exemplary system for depositing beads 36 is disclosed in U.S. patent application Ser. No. 10/191,749, filed Jul. 9, 2002, entitled "System and Method for Dispensing Liquids", and which is assigned to the assignee of the present invention. Imprinting layer 34 is formed from a material 36*a* that may be selectively polymerized and cross-linked to record the original pattern therein, defining a recorded pattern. An exemplary composition for material 36*a* is disclosed in U.S. patent application Ser. No. 10/463,396, filed Jun. 16, 2003 and entitled "Method to Reduce Adhesion Between a Conformable Region and a Pattern of a Mold", which is incorporated by reference in its entirety herein. Material 36*a* is shown in FIG. 4 as being cross-linked at points 36*b*, forming cross-linked polymer material 36*c*.

Figure 5:
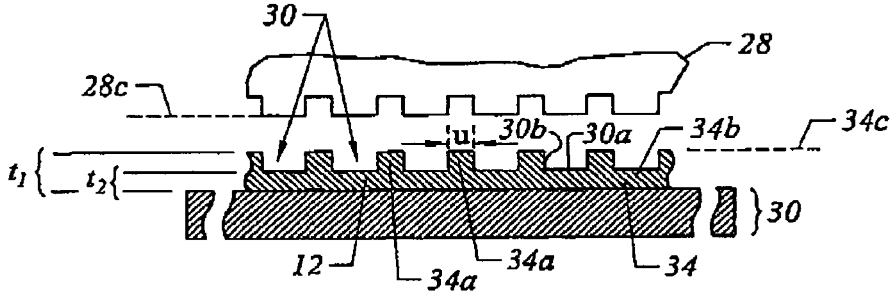
FIG. 5 is a simplified elevation view of a mold spaced-apart from the imprinting layer, shown in FIG. 1, after patterning of the imprinting layer.

Referring to FIGS. 2, 3 and 5, the pattern recorded in imprinting layer 34 is produced, in part, by mechanical contact with mold 28. To that end, imprint head 18 reduces the distance "d" to allow imprinting layer 34 to come into mechanical contact with mold 28, spreading beads 36 so as to form imprinting layer 34 with a contiguous formation of material 36*a* over surface 32. In one embodiment, distance "d" is reduced to allow sub-portions 34*a* of imprinting layer 34 to ingress into and fill recessions 28*a*.

To facilitate filling of recessions 28*a*, material 36*a* is provided with the requisite properties to completely fill recessions 28*a* while covering surface 32 with a contiguous formation of material 36*a*. In the present embodiment, sub-portions 34*b* of imprinting layer 34 in superimposition with protrusions 28*b* remain after the desired, usually minimum distance "d", has been reached, leaving sub-portions 34*a* with a thickness $t_1$, and sub-portions 34*b* with a thickness, $t_2$. Thicknesses "$t_1$" and "$t_2$" may be any thickness desired, dependent upon the application. Typically, $t_1$ is selected so as to be no greater than twice the width u of sub-portions 34*a*, i.e., $t_1 \leqq 2u$, shown more clearly in FIG. 5.

Figure 4:
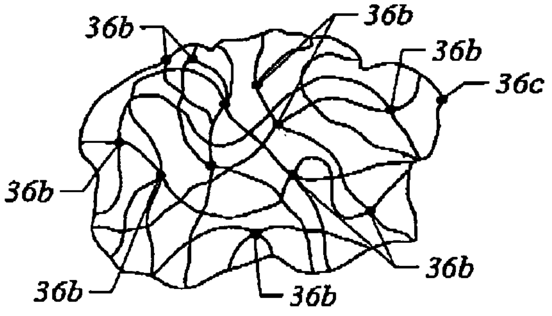
FIG. 4 is a simplified representation of cross-linked polymer material into which the material shown in FIG. 3 is transformed after being subjected to radiation.

Referring to FIGS. 2, 3 and 4, after a desired distance "d" has been reached, radiation source 22 produces actinic radiation that polymerizes and cross-links material 36*a*, forming cross-linked polymer material 36*c*. As a result, the composition of imprinting layer 34 transforms from material 36*a* to material 36*c*, which is a solid. Specifically, material 36*c* is solidified to provide side 34*c* of imprinting layer 34 with a shape conforming to a shape of a surface 28*c* of mold 28, shown more clearly in FIG. 5. After imprinting layer 34 is transformed to consist of material 36*c*, shown in FIG. 4, imprint head 18, shown in FIG. 2, is moved to increase distance "d" so that mold 28 and imprinting layer 34 are spaced-apart.

Figure 6:
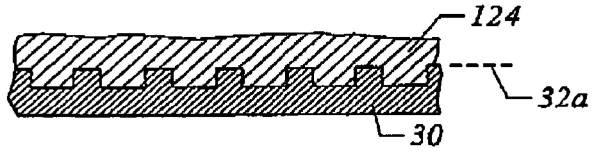
FIG. 6 is a simplified elevation view of an additional imprinting layer positioned atop of the substrate shown in FIG. 5 after the pattern in the first imprinting layer is transferred therein.

Referring to FIG. 5, additional processing may be employed to complete the patterning of wafer 30. For example, wafer 30 and imprinting layer 34 may be etched to transfer the pattern of imprinting layer 34 into wafer 30, providing a patterned surface 32*a*, shown in FIG. 6. To facilitate etching, the material from which imprinting layer 34 is formed may be varied to define a relative etch rate with respect to wafer 30, as desired. The relative etch rate of imprinting layer 34 to wafer 30 may be in a range of about 1.5:1 to about 100:1.

Alternatively, or in addition to, imprinting layer 34 may be provided with an etch differential with respect to photo-resist material (not shown) selectively disposed thereon. The photo-resist material (not shown) may be provided to further pattern imprinting layer 34, using known techniques. Any etch process may be employed, dependent upon the etch rate desired and the underlying constituents that form wafer 30 and imprinting layer 34. Exemplary etch processes may include plasma etching, reactive ion etching, chemical wet etching and the like.

Referring to both FIGS. 1 and 2 an exemplary radiation source 22 may produce ultraviolet radiation. Other radiation sources may be employed, such as thermal, electromagnetic and the like. The selection of radiation employed to initiate the polymerization of the material in imprinting layer 34 is known to one skilled in the art and typically depends on the specific application which is desired. Furthermore, the plurality of features on mold 28 are shown as recessions 28*a* extending along a direction parallel to protrusions 28*b* that provide a cross-section of mold 28 with a shape of a battlement. However, recessions 28*a* and protrusions 28*b* may correspond to virtually any feature required to create an integrated circuit and may be as small as a few tenths of nanometers. As a result, it may be desired to manufacture components of system 10 from materials that are thermally stable, e.g., have a thermal expansion coefficient of less than about 10 ppm/degree centigrade at about room temperature (e.g. 25 degrees Centigrade). In some embodiments, the material of construction may have a thermal expansion coefficient of less than about 10 ppm/degree Centigrade, or less than 1 ppm/degree Centigrade. To that end, bridge supports 12, bridge 14, and/or stage support 16 may be fabricated from one or more of the following materials: silicon carbide, iron alloys available under the trade name INVAR®, or name SUPER INVAR™, ceramics, including but not limited to ZERODUR® ceramic. Additionally table 24 may be constructed to isolate the remaining components of system 10 from vibrations in the surrounding environment. An exemplary table 24 is available from Newport Corporation of Irvine, Calif.

Figure 7:
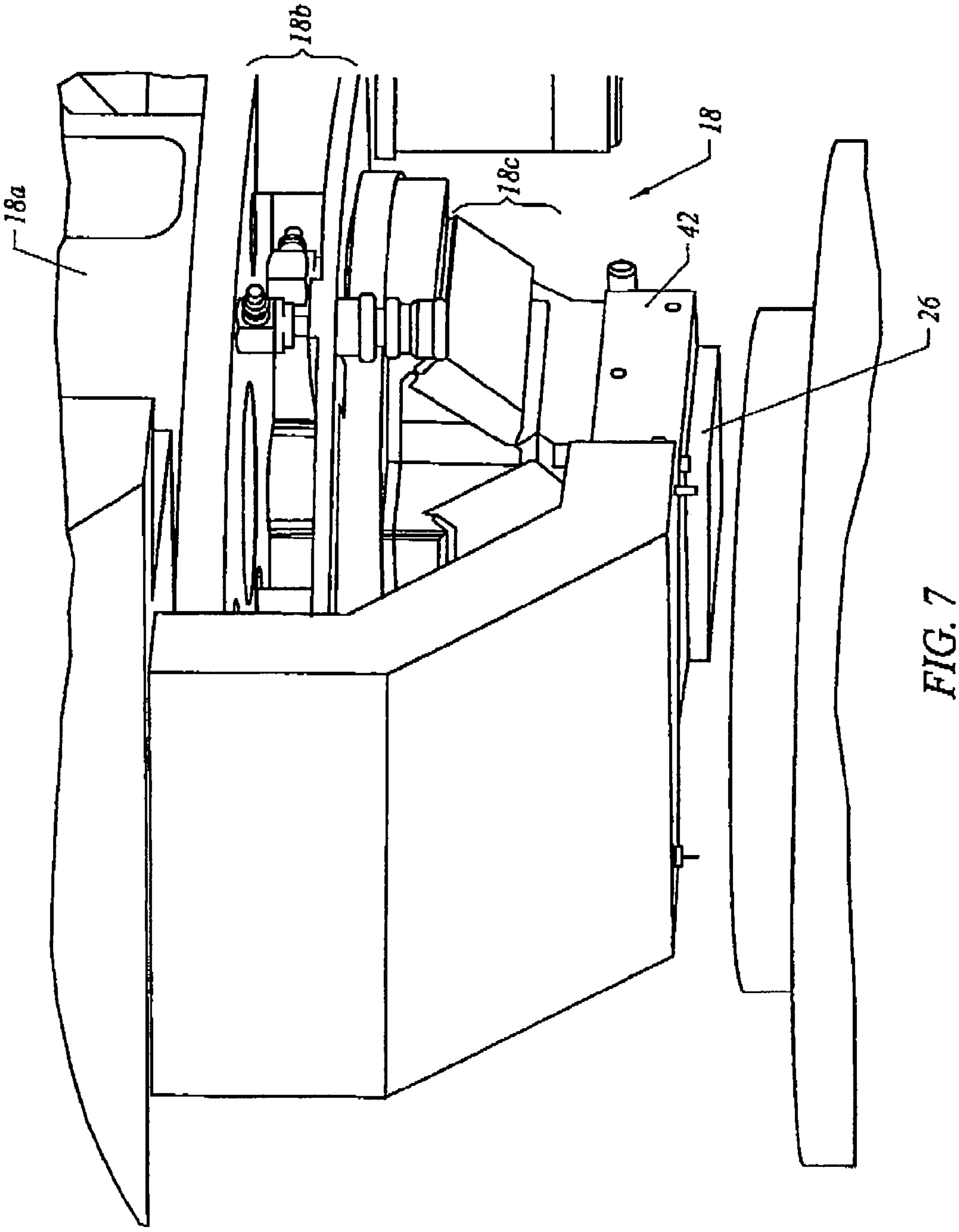
FIG. 7 is a detailed perspective view of a print head shown in FIG. 1.
Figure 8:
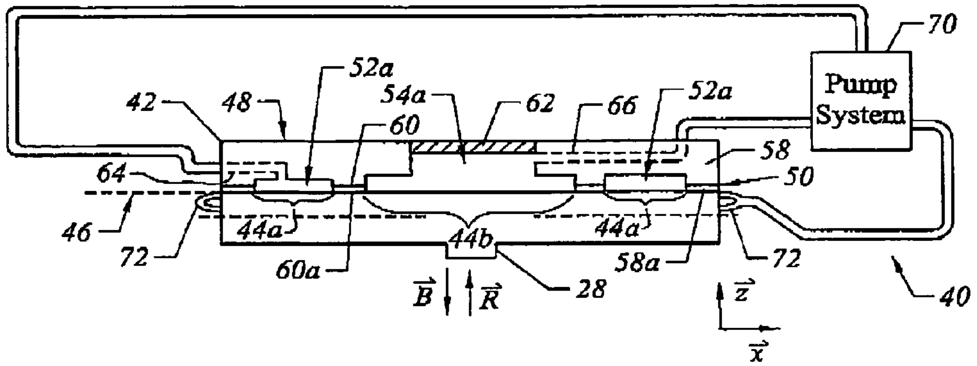
FIG. 8 is a cross-sectional view of a chucking system in accordance with the present invention.

Referring to FIGS. 7 and 8, template 26, upon which mold 28 is present, is coupled to imprint head housing 18*a* via a chucking system 40 that includes chuck body 42. Specifically, a calibration system 18*b* is coupled to imprint head housing 18*a*, and chuck body 42 couples template 26 to calibration system 18*b* vis-à-vis a flexure system 18*c*. Calibration system 18*b* facilitates proper orientation alignment between template 26 and wafer 30, shown in FIG. 5, thereby achieving a substantially uniform gap distance, "d", therebetween.

Figure 9:
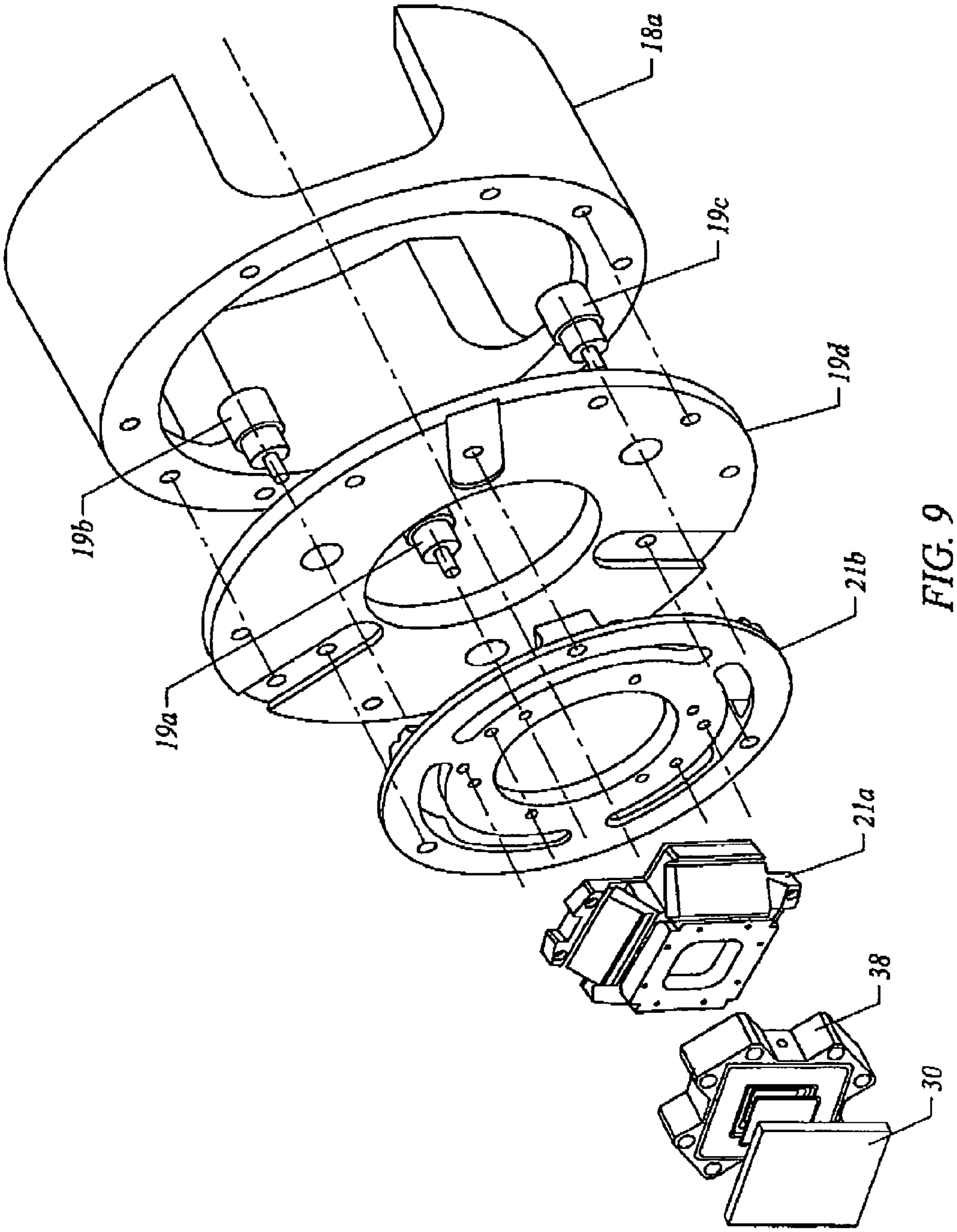
FIG. 9 is an exploded view of an imprint head shown in FIG. 7.

Referring to both FIGS. 7 and 9, calibration system 18*b* includes a plurality of actuators 19*a*, 19*b* and 19*c* and a base plate 19*d*. Specifically, actuators 19*a*, 19*b* and 19*c* are connected between housing 18*a* and base plate 19*d*. Flexure system 18*c* includes flexure springs 21*a* and flexure ring 21*b*. Flexure ring 21*b* is coupled between base plate 19*d* and flexure springs 21*a*. Motion of actuators 19*a*, 19*b* and 19*c* orientates flexure ring 21*b* that may allow for a coarse calibration of flexure springs 21*a* and, therefore, chuck body 42 and template 26. Actuators 19*a*, 19*b* and 19*c* also facilitate translation of flexure ring 21*b* to the Z-axis. Flexure springs 21*a* include a plurality of linear springs that facilitate gimbal-like motion in the X-Y plane so that proper orientation alignment may be achieved between wafer 30 and template 26, shown in FIG. 2.

Figure 10:
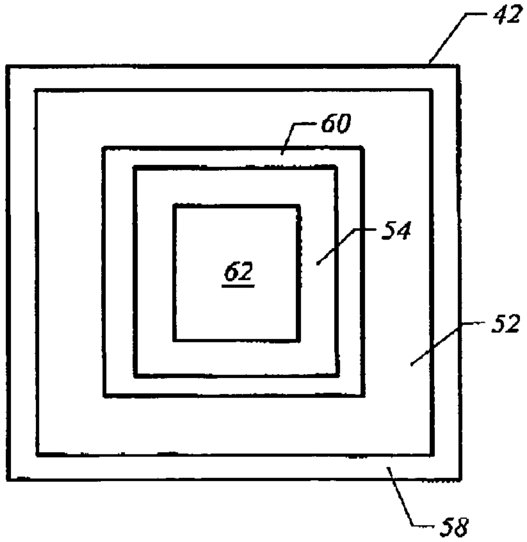
FIG. 10 is a bottom-up plan view of a chuck body shown in FIG. 8.

Referring to FIGS. 8 and 10 chuck body 42 is adapted to retain template 26 upon which mold 28 is attached employing vacuum techniques. To that end, chuck body 42 includes first 46 and second 48 opposed sides. A side, or edge, surface 50 extends between first side 46 and second side 48. First side 46 includes a first recess 52 and a second recess 54, spaced-apart from first recess 52, defining first 58 and second 60 spaced-apart support regions. First support region 58 cinctures second support region 60 and the first 52 and second 54 recesses. Second support region 60 cinctures second recess 54. A portion 62 of chuck body 42 in superimposition with second recess 54 is transparent to radiation having a predetermined wavelength, such as the wavelength of the actinic radiation mentioned above. To that end, portion 62 is made from a thin layer of transparent material, such as glass. However, the material from which portion 62 is made may depend upon the wavelength of radiation produced by radiation source 22, shown in FIG. 2. Portion 62 extends from second side 48 and terminates proximate to second recess 54 and should define an area at least as large as an area of mold 28 so that mold 28 is in superimposition therewith. Formed in chuck body 42 are one or more throughways, shown as 64 and 66. One of the throughways, such as throughway 64 places first recess 52 in fluid communication with side surface 50. The remaining throughway, such as throughway 66, places second recess 54 in fluid communication with side surface 50.

It should be understood that throughway 64 may extend between second side 48 and first recess 52, as well. Similarly, throughway 66 may extend between second side 48 and second recess 54. What is desired is that throughways 64 and 66 facilitate placing recesses 52 and 54, respectively, in fluid communication with a pressure control system, such a pump system 70.

Pump system 70 may include one or more pumps to control the pressure proximate to recesses 52 and 54, independently of one another. Specifically, when mounted to chuck body 42, template 26 rests against first 58 and second 60 support regions, covering first 52 and second 54 recesses. First recess 52 and a portion 44*a* of template 26 in superimposition therewith define a first chamber 52*a*. Second recess 54 and a portion 44*b* of template 26 in superimposition therewith define a second chamber 54*a*. Pump system 70 operates to control a pressure in first 52*a* and second 54*a* chambers. Specifically, the pressure is established in first chamber 52*a* to maintain the position of the template 26 with the chuck body 42 and reduce, if not avoid, separation of template 26 from chuck body 42 under force of gravity. The pressure in the second chamber 54*a* may differ from the pressure in the first chamber 52*a* to, inter alia, reduce distortions in the template 26 that occur during imprinting, by modulating a shape of template 26. For example, pump system 70 may apply a positive pressure in chamber 54*a* to compensate for any upward force R that occurs as a result on imprinting layer 34 contacting mold 28. Additionally, pump system 70 may apply a positive pressure in chamber 54*a* to compensate for any upward force R that occurs as a result on imprinting layer 34 contacting mold 28. In this manner, produced is a pressure differential between differing regions of side 46 so that bowing of template 26 and, therefore, mold 28 under force R is attenuated, if not avoided. Coupled to template 26 is a means for varying dimensions of the same in X and Y directions, with the understanding that the Y-direction is into the plane of FIG. 8. The means for varying dimensions is shown schematically as actuator device 72.

Figure 11:
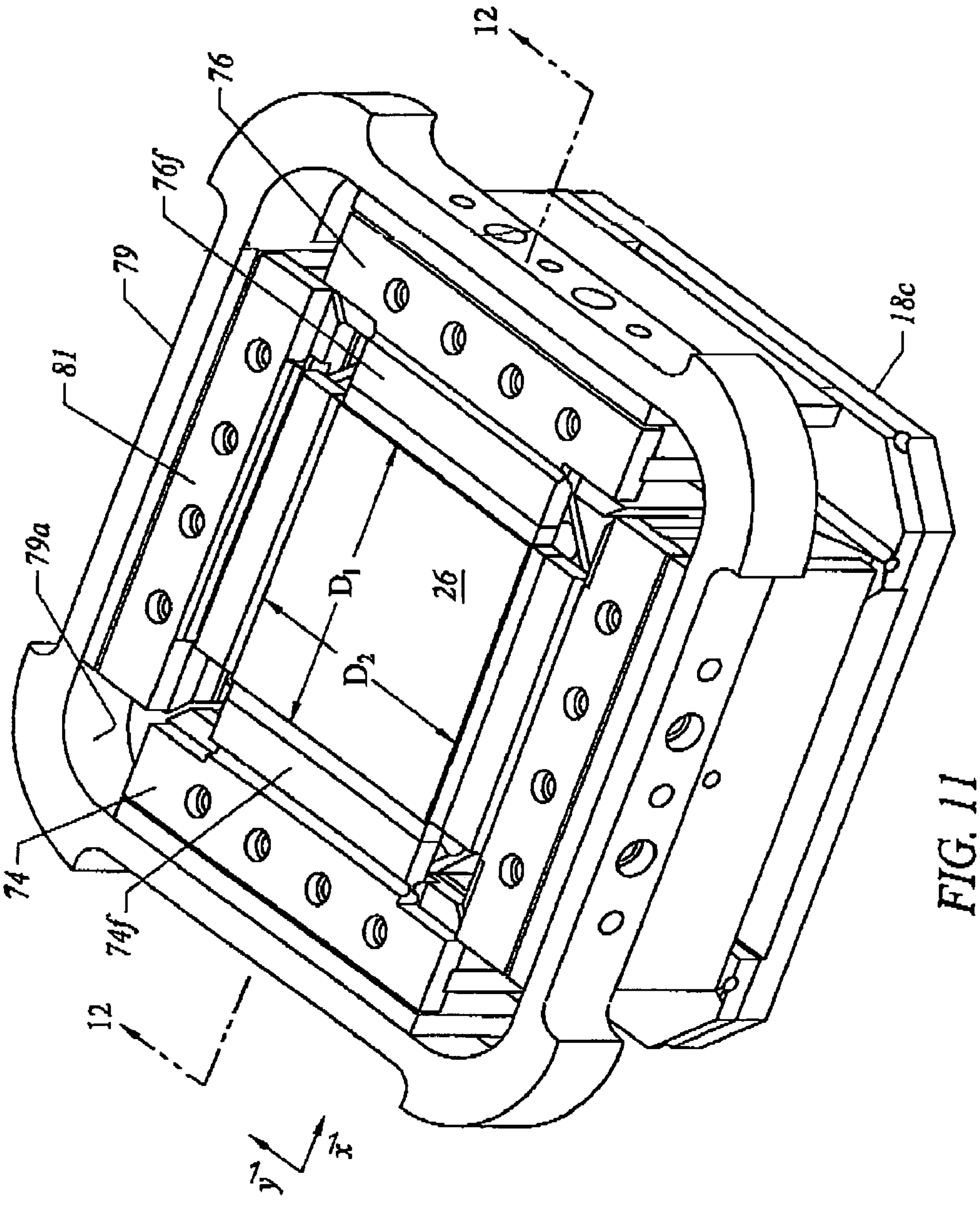
FIG. 11 is a perspective view of an actuator device shown in FIG. 8 and used to vary dimensions of a template.
Figure 12:
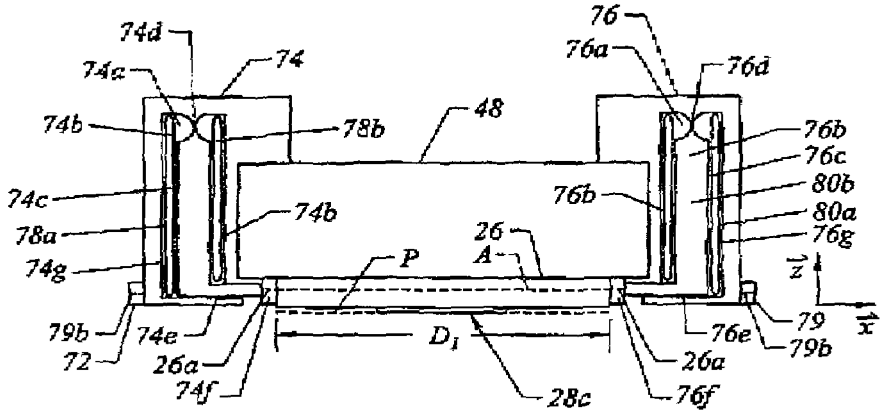
FIG. 12 is a cross-sectional view of the actuator device shown in FIG. 11, taken along lines 12—12.

Referring to FIGS. 8, 11 and 12, in the present example the actuator device 72 includes first and second bodies 74 and 76, mounted on opposite sides of chuck body 42, all of which are mounted to a flexure system 18*c*. At least one of bodies body 74 and 76 includes one or more chambers, shown in body 74 as 74*a*. Disposed within chamber 74*a* is an actuator arm. A first member 74*c* of actuator arm 74*b* is connected to body 74 to reciprocate about an axis 74*d*. First member 74*c* extends from axis 74*d* along the Z direction and terminates in a second member 74*e*. Second member 74*e* extends from first member 74*c* along the X direction and terminates in a contact member 74*f*. At least one bladder is disposed within chamber 74*a*. In the present example two bladders 78*a* and 78*b* are disposed in chamber on opposite sides of first member 74*c*. Specifically, bladder 78*b* disposed between a first sidewall 74*g* of body 74 and first member 74*c*, and bladder 78*b* is disposed between a second side wall 74*h* of body and first member 74*c*. Each of bladders 78*a* and 78*b* has a volume that may be selectively varied in response to introduction of a fluid therein. To that end, each bladder 78*a* and 78*b* is in fluid communication with pump system 70.

Disposed opposite to contact member 74*f* is contact member 76*f* and spaced-apart a distance $D_1$. It is not necessary for contact member 76*f* to be coupled to move with respect to body 76. As a result, contact member 76*f* may be rigidly attached to body 76. As shown, however, contact member is shown connected to a second portion of actuator arm 76, and first member 76*c* of actuator arm 76*b* is connected to body 76 to reciprocate about an axis 76*d*. First member 76*c* extends from axis 76*d* along the Z direction and terminates in a second member 76*e*. Second member 76*e* extends from first member 76*c* along the X direction and terminates in a contact member 76*f*. At least one bladder is disposed within chamber 76*a*. In the present example two bladders 80*a* and 80*b* are disposed in chamber 76*a* on opposite sides of first member 76*c*. Specifically, bladder 80*b* disposed between a first sidewall 76*g* of body 76 and first member 76*c*, and bladder 80*b* is disposed between a second side wall 76*h* of body and first member 76*c*. Each of bladders 80*a* and 80*b* has a volume that may be selectively varied in response to introduction of a fluid therein. To that end, each bladder 80*a* and 80*b* is in fluid communication with pump system 70.

During operation, template 26 is disposed between contact members. Typically the distance $D_1$ is established to be slightly smaller than the distance between the opposed regions of perimeter surface 26*a* of template 26 in contacted therewith. In this manner, template 26 is described as being compressively pre-loaded. To compress template 26, one or both of bladders 78*a* and 80*a* may be inflated to increase the volume thereof. Expansion of bladder 78*a* causes actuator arm 74*b* to move about axis 74*d* toward sidewall 74*h*, thereby decreasing the magnitude of distance $D_1$. Expansion of bladder 80*a* causes actuator arm 76*b* to move about axis 76*d* toward sidewall 76*h*, thereby decreasing the magnitude of distance $D_1$. To reduce the compression forces on template 26, the volume of bladders 78*a* and 80*a* may be reduced to return to nominal size. To expand the distance $D_1$ so that template 26 is not compressively pre-loaded, and/or may be easily decoupled from actuator device 72, one or both of bladders 78*b* and 80*b* may be expanded. Expansion of bladder 78*b* causes actuator arm 74*b* to move about axis 74*d* toward sidewall 74*g*, thereby increasing the magnitude of distance $D_1$. Expansion of bladder 80*b* causes actuator arm 76*b* to move about axis 76*d* toward sidewall 76*g*, thereby increasing the magnitude of distance $D_1$. Expansion of bladders 78*b* and 80*b* may also occur as the volume of bladders 78*a* and 80*a* is decreased. By appropriately controlling a rate at which one or more of bladders 78*b* and 80*b* are expanded and one or both of bladders 78*b* and 80*b* are deflated, the time required to return substrate to a compressively pre-loaded state may be reduced Referring to both FIGS. 11 and 12, a problem encountered during operation concerned a force applied against side walls 74*g* and 76*g* when large compression forces were applied to perimeter surface 26*a*. In these situations expansion of bladder 78*a* exerted a force applied to side wall 76*g* and expansion of bladder 80*a* exerted a force on side wall 76*g*. The forces exerted on one or both of side walls 74*g* and 76*g* resulted in bending moment on chuck body 42, which is transmitted onto template 26. Ideally, template 26 should be subjected to purely compressive forces, with bending forces being substantially minimized, if not avoid entirely. Bending forces on substrate are problematic in that is results in pattern distortion. Substantially reduce the aforementioned bending moment, a compression ring 79 is provided. Compression ring 79 surrounds an area 81 and includes a surface 79*a* facing the area 81. Bodies 74 and 76 are connected to surface 79*a* and disposed opposite one another. In this manner, the force exerted by bladder 78*a* on sidewall 74*g* creates an equal and opposite force on a region of compression ring 79 disposed opposite to body 74. Similarly, the force exerted by bladder 80*a* on sidewall 76*g* creates an equal and opposite force on a region of compression ring 79 disposed opposite to body 76. To maximize the effectiveness of compression ring 79, a neutral axis 79*a* thereof, is closely aligned with a neutral axis A of template 26.

It is possible to employ actuator device 72 to expand template 26, as well. To that end, contact members 74*f* and 76*f* would be fixedly attached to perimeter surface 26*a*. This may be achieved, for example, with the use of adhesives. The second members 74*e* and 76*e* would then be coupled to contact members, 74*f* and 76*f*, respectively by, for example, a threaded coupling and/or adhesives. Tensile forces would be applied to template 26 by expanding one or both of bladders 78*b* and 80*b*.

An advantage with the present design is that the entire actuator device 72 is positioned to lie on one side of mold 28 so as to be spaced-apart from a plane in which mold surface 28*c* lies. This is beneficial in preventing contact between the components of actuator device 72 and a wafer 30, shown in FIG. 5, during imprint processes. Additionally, by providing a relatively long firm member 74*c* and 76*c*, that area upon which a force may be exerted by bladders 74*a*, 74*b*, 76*a* and 76*b* may be substantially increased. This facilitates increasing the per unit area of force applied to perimeter surface 76*a* by contact members 74*f* and 76*f*. The amplification of the force per unit area exerted by contact member 74*f* is a function of the ratio of two areas: the area of perimeter surface 26*a* upon which contact members 74*f* exerts a force and the area of first member 74*fc* over which one of bladders 78*a* and 78*b* exerts a force. Similarly, the amplification of the force per unit area exerted by contact member 76*f* is a function of the ratio of two areas: the area of perimeter surface 26*a* upon which contact members 76*f* exerts a force and the area of first member 76*c* over which one of bladders 80*a* and 80*b* exerts a force.

Bladders 78*a*, 78*b*, 80*a*, and 80*b* provide an additional advantage of avoiding localized force concentration on actuator arms 74*b* and 76*b* due to, for example, roughness of the surface in contact therewith. Specifically, the surface roughness of actuator arms 74*b* and 76*b* may result in an uneven distribution of the force applied thereon by bladders 78*a*, 78*b*, 80*a*, and 80*b*. As a result, there can be localized surface concentrations of the force created by the bladders 78*a*, 78*b*, 80*a*, and 80*b* that may result in non-linear compression. Bladders 78*a*, 78*b*, 80*a*, and 80*b* reduce, if not avoid, this problem by being formed of compliant material that takes the shape of the area against which contact is made. As a result, an even distribution of forces is exerted on over the contact area. For similar reasons, it may be desired to form contact members 74*f* and 76*f* from compliant material so that the same forms a profile that matches the profile of the perimeter surface 26*a* that comes in contact therewith.

An additional benefit provided by using compliant bladders 78*a*, 78*b*, 80*a*, and 80*b* is that the same compensates for any non-planarity and/or roughness over the area of perimeter surface 26*a*, referred hereafter as surface anomalies, that comes into contact with the contact members 74*f* and 76*f*. Specifically, bladders 78*a*, 78*b*, 80*a*, and 80*b* may conform to any distortion of first members 74*c* and 76*c* result from any bending moment exerted thereupon by contact members 74*f* and 76*f*. To further increase compliance with any surface anomalies body 74 may include a plurality of contact members, shown as 174*f*, 274*f*, 374*f* and 474*f*, each of which is attached to a separate actuator arm (not shown) that is mounted to body 74 as discussed above with respect to actuator arm 74*b*. Bladders 78*a* and 78*b* could facilitate movement of contact members as discussed above with respect to contact member 74*f*. Similarly, body 76 may include a plurality of include a plurality of contact members, shown as 176*f*, 276*f*, 376*f* and 476*f*, each of which is attached to a separate actuator arm (not shown) that is mounted to body 76, as discussed above with respect to actuator arm 76*b*. Bladders 80*a* and 80*b* could facilitate movement of contact members 176*f*, 276*f*, 376*f* and 476*f* with respect to contact member 76*f*.

Figure 14:
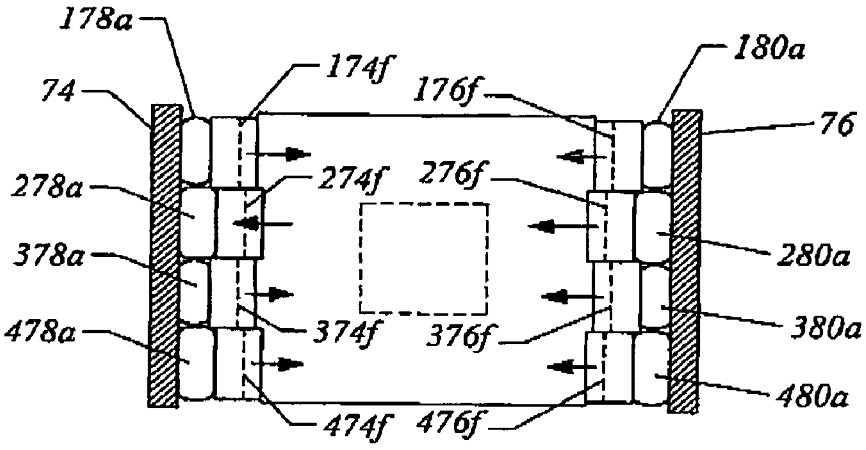
FIG. 14 is a bottom up view of the actuator device shown in FIG. 13 in accordance with a second alternate embodiment.

Referring to FIGS. 12 and 14, further compliance with surface anomalies may be achieved by allowing independent control over the movement of the plurality of contact members 174*f*, 274*f*, 374*f*, 474*f*, 176*f*, 276*f*, 376*f* and 476*f*. To that end, bladder 78*a* may be replaced with a plurality of bladders 178*a*, 278*a*, 378*a*, 478*a*, each of which is in fluid communication with pump system 70. Each of the plurality of bladders 178*a*, 278*a*, 378*a*, 478*a* is coupled to move one of contact members 174*f*, 274*f*, 374*f*, 474*f* that differs from the contact members 174*f*, 274*f*, 374*f*, 474*f* that the remaining bladders 178*a*, 278*a*, 378*a*, 478*a* are coupled to move. For the same reasons, bladder 80*a* may be replaced with a plurality of bladders 180*a*, 280*a*, 380*a*, 480*a*, each of which is in fluid communication with pump system 70. Each of bladders 180*a*, 280*a*, 380*a*, 480*a* is coupled to move one of contact members 176*f*, 276*f*, 376*f*, 476*f* that differs from the contact members 176*f*, 276*f*, 376*f*, 476*f* that the remaining bladders 180*a*, 280*a*, 380*a*, 480*a* are coupled to move. Although the foregoing has been discussed with replacing bladders 78*a* and 80*a* with a plurality of bladders, bladders 78*b* and 80*b* may also be replaced with a plurality of bladders to achieve independent control over contact members 174*a*, 274*f*, 374*f*, 474*f*, 176*f*, 276*f*, 376*f* and 476*f* when applying a tensile force to template 26.

An additional benefit with providing independent control over the movement of the plurality of contact members 174*f*, 274*f*, 374*f*, 474*f*, 176*f*, 276*f*, 376*f* and 476*f* is that is facilitates compensation for errors caused by anisotropic thermal expansion of template 26. Thus, it may be desirable to obtain an accurate determination of the temperature of template 26 and include information derived therefrom to determine the proper compression applied among contact members 174*f*, 274*f*, 374*f*, 474*f*, 176*f*, 276*f*, 376*f* and 476*f*.

Figure 15:
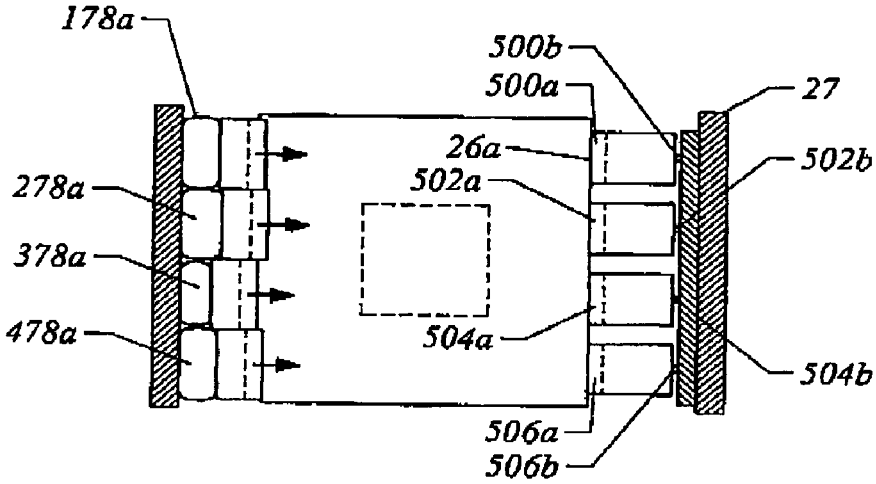
FIG. 15 is a bottom up view of the actuator device shown in FIG. 13 in accordance with a third alternate embodiment.

Referring to FIGS. 12, 14 and 15 although the foregoing has discussed use of bladders, it is possible to replace any of the bladders 78*a*, 78*b*, 80*a*, 80*b*, 178*a*, 278*a*, 378*a*, 478*a*, 180*a*. 280*a*, 380*a* and 480*a* with a piezo actuator, four of which are shown as 500, 502, 504 and 506. The contact region between each, shown as 500*a*, 502*a*, 504*a* and 506*a* is allowed to flex with respect of the interface of contact regions 500*a*, 502*a*, 504*a* and 506*a* with perimeter surface 26. To that end, each of piezo actuators is coupled to body 76 via flexures 500*b*, 502*b*, 504*b* and 506*b*, respectively. Working synergistically, piezo actuators 500, 502, 504 and 506 may be employed to compensate for surface anomalies and bladders 178*a*, 278*a*, 378*a* and 478*a* may be employed to compensate for large mean errors for differing templates coupled to chuck body 42. This facilitates maintaining template 26 centering respect to a machine coordinate frame.

Figure 13:
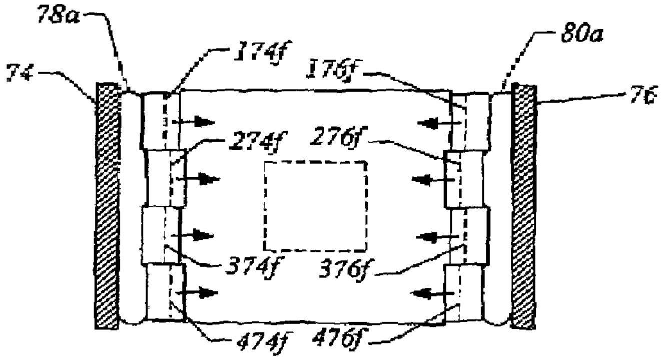
FIG. 13 is a bottom up view of the actuator device shown in FIG. 12 in accordance with a first alternate embodiment.

Although piezo actuators are shown in combination with the plurality of bladders 178*a*, 278*a*, 378*a* and 478*a*, any combination piezo actuators and bladders may be employed in actuator device 72. For example, only one piezo actuator may be employed on one body for example, body, 74, with body 76 contact one or more contact members being rigidly attached thereto or having including any of the bladder combinations shown in FIGS. 11, 12 and 13. Also, it is possible that all bladders associated with compression device be replaced with piezo actuators.

Referring to FIG. 11 may be desired to include an additional pair of contact members 73 and 75 to vary a distance therebetween $D_2$ in a direction orthogonal to the direction in which distance $D_1$ is varied. In this manner the dimension of template 26 may be varied in two dimensions. This is particularly useful in overcoming Poisson's effect. Poisson's effect may result in linear coupling of template 26 that may necessitate activating actuators to vary both distances $D_1$ and $D_2$. Specifically, the Poisson ratio is the ratio between the tensile strain caused in the Y and Z directions in template 26 to the compressive strain imparted to template 26 in the X direction. Typical numbers are in the range of 0.1–0.4. Were template 26 formed from fused silica is the ratio is approximately 0.16. A dimensional changed that is purely in the X direction, therefore, i.e., with no dimensional change in the Y direction being desired, may necessitated activation of actuators to vary both distanced $D_1$ and $D_2$, to compensate for Poisson's effect. With any of the above-described configurations of actuator device 72, a force may be applied to template 26 to vary the dimensions of the same and reduce distortions in the pattern recorded into imprinting layer 34, shown in FIG. 2.

Specifically, distortions in the pattern recorded into imprinting layer 34 may arise from, inter alia, dimensional variations of imprinting layer 34 and wafer 30. These dimensional variations, which may be due in part to thermal fluctuations, as well as, inaccuracies in previous processing steps that produce what is commonly referred to as magnification/run-out errors. The magnification/run-out errors occur when a region of wafer 30 in which the original pattern is to be recorded exceeds the area of the original pattern. Additionally, magnification/run-out errors may occur when the region of wafer 30, in which the original pattern is to be recorded, has an area smaller than the original pattern. The deleterious effects of magnification/run-out errors are exacerbated when forming multiple layers of imprinted patterns, shown as imprinting layer 124 in superimposition with patterned surface 32*a*, shown in FIG. 6. Proper alignment between two superimposed patterns is difficult in the face of magnification/run-out errors in both single-step full wafer imprinting and step-and-repeat imprinting processes.

Figure 16:
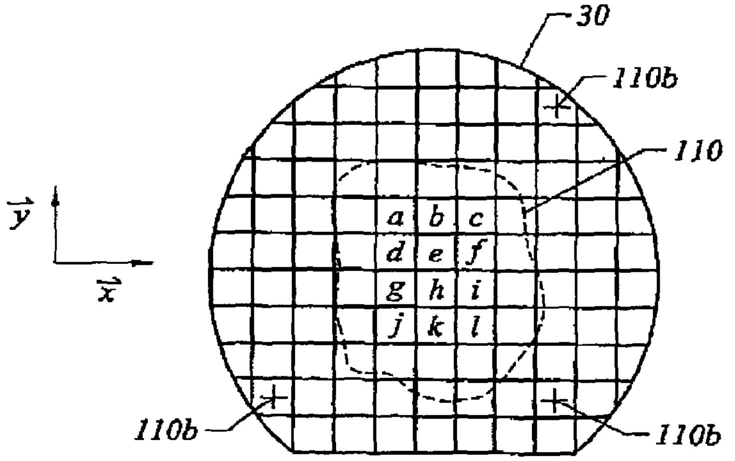
FIG. 16 is a top down view of a wafer, shown in FIGS. 2, 5 and 6 upon which imprinting layers are disposed.
Figure 17:
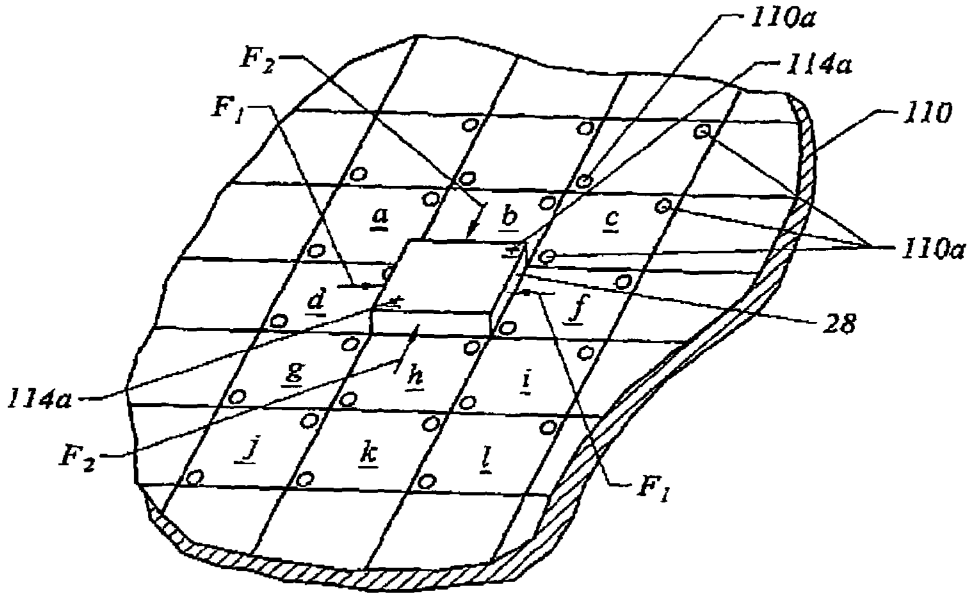
FIG. 17 is a detailed view of FIG. 16 showing the position of the mold in one of the imprint regions.

Referring to FIGS. 16 and 17, a step-and-repeat process includes defining a plurality of regions, shown as, a–1, on wafer 30 in which the original pattern on mold 28 will be recorded. The original pattern on mold 28 may be coextensive with the entire surface of mold 28, or simply located to a sub-portion thereof. The present invention will be discussed with respect to the original pattern being coextensive with the surface of mold 28 that faces wafer 30. Proper execution of a step-and-repeat process may include proper alignment of mold 28 with each of regions a–1. To that end, mold 28 includes alignment marks 114*a*, shown as a "+" sign. One or more of regions a–1 includes fiducial marks 110*a*. By ensuring that alignment marks 114*a* are properly aligned with fiducial marks 110*a*, proper alignment of mold 28 with one of regions a–1 in superimposition therewith is ensured. To that end, machine vision devices (not shown) may be employed to sense the relative alignment between alignment marks 114*a* and fiducial marks 110*a*. In the present example, proper alignment is indicated upon alignment marks 114*a* being in superimposition with fiducial marks 110*a*. With the introduction of magnification/run-out errors, proper alignment becomes very difficult.

However, in accordance with one embodiment of the present invention, magnification/run-out errors are reduced, if not avoided, by creating relative dimensional variations between mold 28 and wafer 30. Specifically, the temperature of wafer 30 is varied so that one of regions a–1 defines an area that is slightly less than an area of the original pattern on mold 28. Thereafter, the final compensation for magnification/run-out errors is achieved by subjecting template 26, shown in FIG. 8, to mechanical compression forces using actuator device 72, which are in turn transferred to mold 28 shown by arrows $F_1$ and $F_2$, orientated transversely to one another, shown in FIG. 17. In this manner, the area of the original pattern is made coextensive with the area of the region a–1 in superimposition therewith.

Referring to both FIGS. 5 and 8, subjecting template 26 to compressive forces, however, modulates the shape of the same through bending action. Bending of template 26 may also introduce distortions in the pattern imprinted into imprinting layer 34. The pattern distortions attributable to bending of template 26 may be reduced, if not prevented, by positioning actuator device 72 so that the bending of template 26 is controlled to occur in a desired direction. In the present example, actuator device 72 is positioned to compress template 26 so as to bow in a direction parallel to, and opposite of, force R. By controlling the bending of template 26 in this manner, chucking system 40 may be employed to counter the bending force, B, so as to establish mold 28 to be a desired shape, e.g., arcuate, planar and the like. Pump system 70 may be employed to pressurize chamber 54*a* appropriately to that end. For example, assuming bending force, B, is greater than force R, pump system 70 would be employed to evacuate chamber 54*a* with sufficient vacuum to counter the bending force B. Were bending force B weaker than force, R, pump system 70 would be employed to pressurize chamber 54*a* appropriately to maintain planarity of mold 28, or any other desired shape. The exact pressure levels may be determined with a priori knowledge of the forces R and B which then may be analyzed by a processor (not shown) that may be included in pump system 70 to pressurize chambers 52*a* and 54*a* to the appropriate levels. Also, the forces R and B may be sensed dynamically using known techniques so that the pressure within chambers 52*a* and 54*a* may be established dynamically during operation to maintain template 26 with a desired shape. An added benefit is that the pressure in one or both chambers 52*a* and 54*a* may be established to be a positive pressure, thereby facilitating removal of template 26 from chuck body 42. This also may be accomplished under processor control, or manually.

Referring again to FIG. 8, when compressing template 26 with actuator device 72, relative movement between template 26 and support regions 58 and 60 occurs along the X and Y axes. As a result, it is desired that support regions 58 and 60 have surface regions 58*a* and 60*a*, respectively, formed thereon from a material adapted to conform to a profile of said template 26 and resistant to deformation along the X and Y axes. In this manner, surface regions 58*a* and 60*a* resist relative movement of template 26 with respect to chuck body 42 in the X and Y directions.

Figure 18:
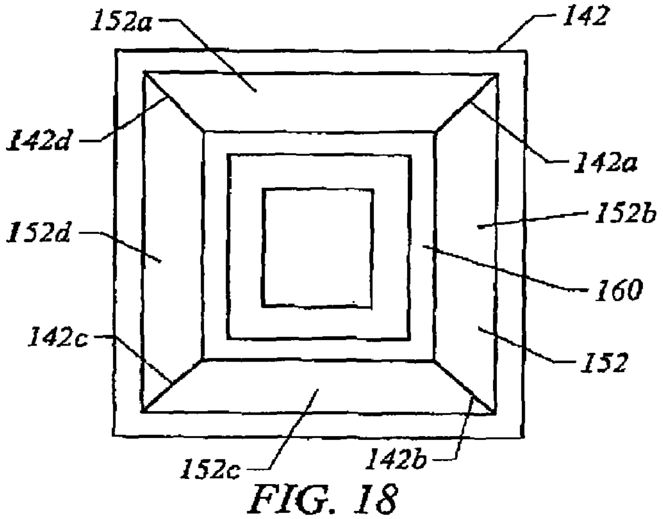
FIG. 18 is a bottom-up plan view of the chuck body shown in FIG. 8 in accordance with an alternate embodiment.

Referring to FIGS. 8 and 18, in another embodiment, chuck body 142 may include one or more walls, or baffles, shown as 142*a*, 142*b*, 142*c* and 142*d* extending between first and second support regions 158 and 160. In this fashion, walls/baffles 142*a*, 142*b*, 142*c* and 142*d* segment recess 152 into a plurality of sub-regions 152*a*, 152*b*, 152*c* and 152*d* that function as sub-chambers once template 26 is placed in superimposition therewith. Sub-chambers 152*a*, 152*b*, 152*c* and 152*d* may be fluid-tight which would result in each have a throughway (not shown) placing the same in fluid communication with pump system 70. Alternatively, or in conjunction therewith, sub-chambers 152*a*, 152*b*, 152*c* and 152*d* may not form fluid-tight chambers once template 26 is placed in superimposition therewith. Rather walls 142*a*, 142*b*, 142*c* and 142*d* would be spaced apart from template 26 to function as a baffle for fluid transfer across the same. As a result, with the appropriate pressure level being provided by pump system 70 to recess 152, a pressure differential could be provided between sub-chambers 152*a*, 152*b*, 152*c* and 152*d*, as desired.

Referring to both FIGS. 2 and 18, providing walls/baffles 142*a*, 142*b*, 142*c* and 142*d* this configuration, sub-regions 152*a*, 152*b*, 152*c* and 152*d* may be concurrently provided with differing pressure levels. As a result, the amount of force exerted on template 26 when being pulled-apart from imprinting layer 34 may vary across the surface of template 26. This allows cantilevering, or peeling-off of template 26 from imprinting layer 34 that reduces distortions or defects from being formed in imprinting layer 34 during separation of template 26 therefrom. For example, sub-chamber 152*b* may have a pressure established therein that is greater than the pressure associated with the remaining sub-chambers 152*a*, 152*c* and 152*d*. As a result, when increasing distance "d" the pulling force of the portion of template 26 in superimposition with sub-chambers 152*a*, 152*c* and 152*d* is subjected to is greater than the pulling force to which the portion of template 26 in superimposition with sub-chamber 152*b* is subjected. Thus, the rate that "d" increases for the portion of template 26 in superimposition with sub-chambers 152*a*, 152*c* and 152*d* is accelerated compared to the rate at which "d" increases for the portion of template 26 in superimposition with sub-chamber 152*b*, providing the aforementioned cantilevering effect.

Figure 19:
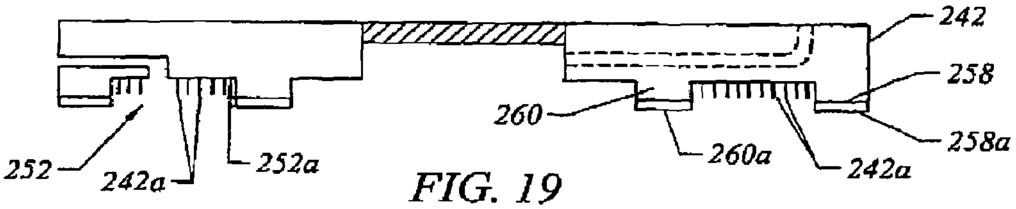
FIG. 19 is a cross-sectional view of a chuck body shown in FIG. 8 in accordance with a second alternate embodiment.

In yet another embodiment, shown in FIG. 19, chuck body 242 includes a plurality of pins 242*a* projecting from a nadir surface 252*a* of out recess 252. Pins 242*a* provide mechanical support for the wafer (not shown] retained on chuck body 242 via vacuum. This enables support regions 258 and 260 to have surface regions 258*a* and 260*a*, respectively, formed from material that is fully compliant with the surface (not shown) of the wafer (not shown) resting against support regions 258 and 260. In this manner, surface regions 258*a* and 260*a* provide a fluid-tight seal with the wafer (not shown) in the presence of extreme surface variation, e.g., when particulate matter is present between the surface (not shown) of the wafer (not shown) and the surface regions 258*a* and 260*a*. Mechanical support of the wafer (not shown) in the Z direction need not be provided by surface regions 258*a* and 260*a*. Pins 242*a* provide this support. To that end, pins 242*a* are typically rigid posts having a circular cross-section.

Figure 20:
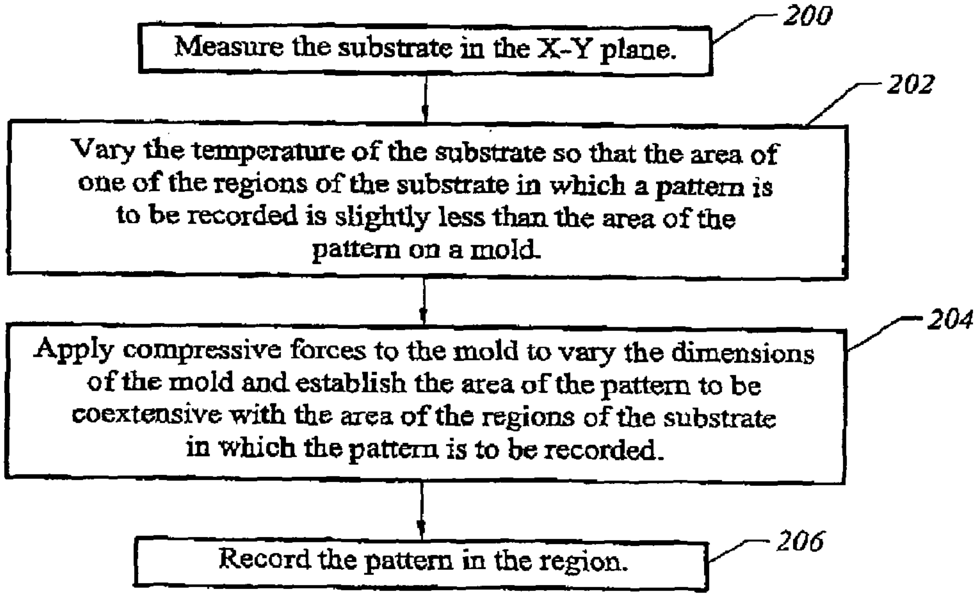
FIG. 20 is a flow diagram showing a method of reducing distortions in patterns formed using imprint lithography techniques in accordance with the present invention.

Referring to FIGS. 16, 17 and 20, in operation, an accurate measurement of wafer 30 in an X-Y plane is undertaken at step 200. This may be achieved by sensing gross alignment fiducials 110*b* present on wafer 30 using machine vision devices (not shown) and known signal processing techniques. At step 202, the temperature of wafer 30 may be varied, i.e., raised or lowered, so that the area of one of regions a–1 is slightly less than an area of the original pattern on mold 28. The temperature variations may be achieved using a temperature controlled chuck or pedestal (not shown) against which wafer 30 rests. The area of each of regions a–1 can be determined by measurement of a change in distance between two collinear gross alignment fiducials 110*b*.

Specifically, a change in the distance between two gross alignment fiducials 110*b* collinear along one of the X or Y axes is determined. Thereafter, this change in distance is divided by a number of adjacent regions a–1 on the wafer 30 along the X-axis. This provides the dimensional change of the areas of regions a–1 attributable to dimensional changes in wafer 30 along the X-axis. If necessary the same measurement may be made to determine the change in area of regions a–1 due to dimensional changes of wafer 30 along the Y-axis. However, it may also be assumed that the dimensional changes in wafer 30 may be uniform in the two orthogonal axes, X and Y.

At step 204, compressive forces, $F_1$ and $F_2$, are applied to mold 28 to establish the area of the original pattern to be coextensive with the area of one of the regions a–1 in superimposition with the pattern. This may be achieved in real-time employing machine vision devices (not shown) and known signal processing techniques, to determine when two or more of alignment marks 114*a* are aligned with two or more of fiducial marks 110*a*. At step 206, after proper alignment is achieved and magnification/run-out errors are reduced, if not vitiated, the original pattern is recorded in the region a–1 that is in superimposition with mold 28, forming the recorded pattern. It is not necessary that compression forces $F_1$ and $F_2$ have the same magnitude, as the dimensional variations in either wafer 30 or mold 28 may not be uniform in all directions. Further, the magnification/run-out errors may not be identical in both X-Y directions. As a result, compression forces, $F_1$ and $F_2$ may differ to compensate for these anomalies. Furthermore, to ensure greater reduction in magnification/run-out errors, the dimensional variation in mold 28 may be undertaken after mold 28 contacts imprinting layer 124, shown in FIG. 6. However, this is not necessary.

Referring again to FIGS. 6, 16 and 17, the alignment of mold 28 with regions a–1 in superimposition therewith may occur with mold 28 being spaced-apart from imprinting layer 124. Were it found that the magnification/run-out errors were constant over the entire wafer 30, then the magnitude of forces $F_1$ and $F_2$ could be maintained for each region a–1 in which the original pattern is recorded. However, were it determined that the magnification/run-out errors differed for one or more regions a–1, steps 202 and 204, shown in FIG. 15, would then be undertaken for each region a–1 in which the original pattern is recorded. It should be noted that there are limits to the relative dimensional changes that may occur between wafer 30 and mold 28. For example, the area of the regions a–1 should be of appropriate dimensions to enable pattern on mold 28 to define an area coextensive therewith when mold 28 is subject to compression forces $F_1$ and $F_2$, without compromising the structural integrity of mold 28.

Figure 21:
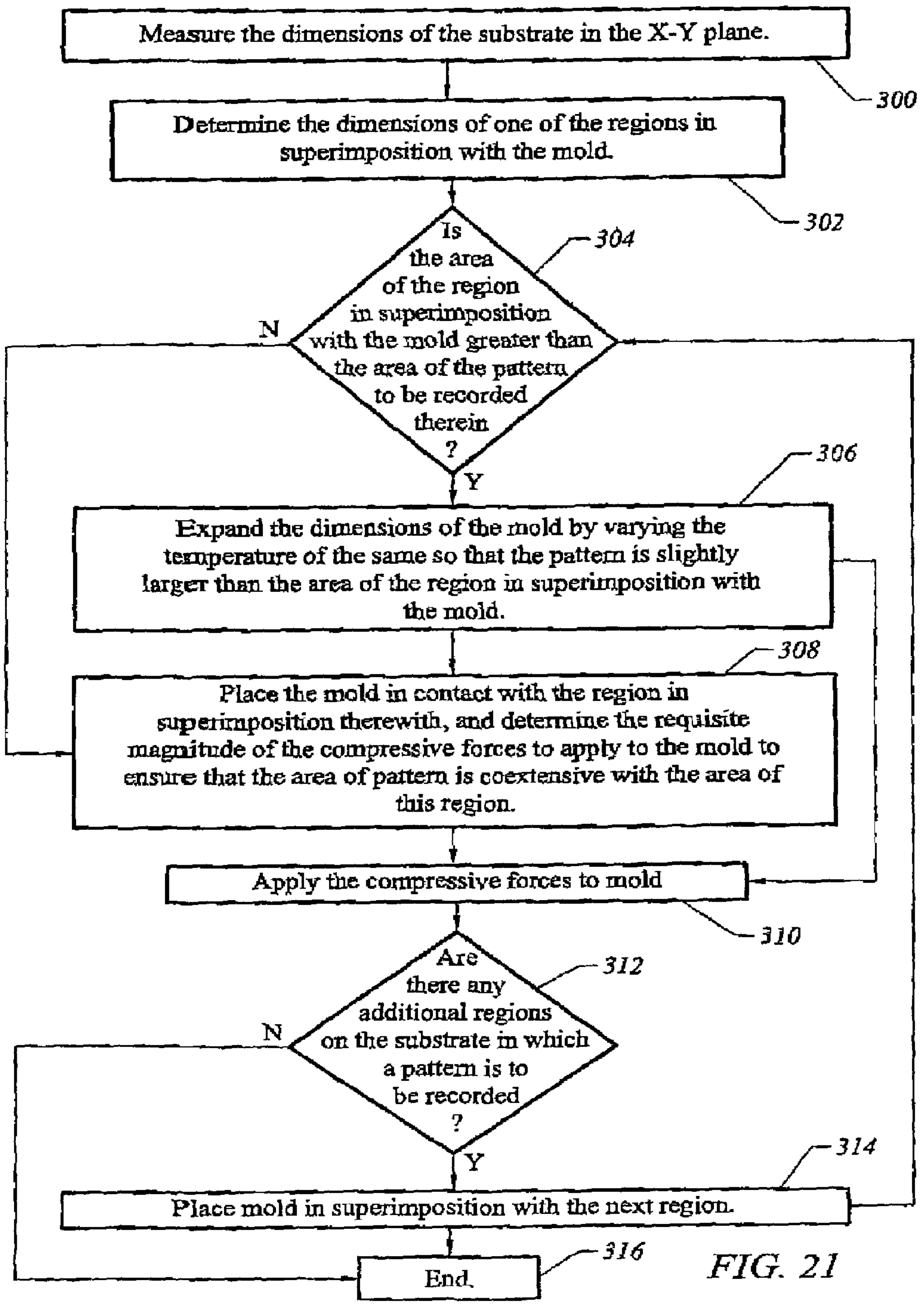
FIG. 21 is a flow diagram showing a method of reducing distortions in patterns formed using imprint lithography techniques in accordance with an alternate embodiment of the present invention.

Referring to FIGS. 5 and 21, in accordance with another embodiment of the present invention, accurate measurement of wafer 30 in an X-Y plane is undertaken at step 300. At step 302, the dimensions of one of regions a–1 in superimposition with mold 28 is determined. At step 304 it is determined whether the area of one of regions a–1 in superimposition with mold 28 is larger than the area of the pattern on mold 28. If this is the case, the process proceeds to step 306, otherwise the process proceeds to step 308. At step 308, mold 28 is placed in contact with the region a–1 in superimposition therewith, and the requisite magnitude of compressive forces $F_1$ and $F_2$ is determined to apply to mold 28 to ensure that the area of pattern is coextensive with the area of this region a–1. At step 310, compressive forces $F_1$ and $F_2$ are applied to mold 28. Thereafter, mold 28 is spaced-apart from the region a–1 in superimposition with mold 28 and the process proceeds to step 312 where it is determined whether there remain any regions a–1 on wafer 30 in which to record the original pattern. If there are, the process proceeds to step 314 wherein mold is placed in superimposition with the next region and the process proceeds to step 304. Otherwise, the process ends at step 316.

Were it determined at step 304 that the region a–1 in superimposition with mold 28 had an area greater than the area of the pattern, then the process proceeds to step 306 wherein the temperature of mold 28 is varied to cause expansion of the same. In the present embodiment, mold 28 is heated at step 306 so that the pattern is slightly larger than the area of region a–1 in superimposition therewith. Then the process continues at step 310.

The embodiments of the present invention described above are exemplary. Many changes and modifications may be made to the disclosure recited above, while remaining within the scope of the invention. For example, by pressurizing all chambers formed by the chuck body-substrate combination with positive fluid pressure, the substrate may be quickly released from the chuck body. Further, many of the embodiments discussed above may be implemented in existing imprint lithography processes that do not employ formation of an imprinting layer by deposition of beads of polymerizable material. Exemplary processes in which differing embodiments of the present invention may be employed include a hot embossing process disclosed in U.S. Pat. No. 5,772,905, which is incorporated by reference in its entirety herein. Additionally, many of the embodiments of the present invention may be employed using a laser assisted direct imprinting (LADI) process of the type described by Chou et al. in *Ultrafast and Direct Imprint of Nanostructures in Silicon*, Nature, Col. 417, pp. 835–837, June 2002. Therefore, the scope of the invention should be determined not with reference to the above description, but instead should be determined with reference to the appended claims along with their full scope of equivalents.

What is claimed is:

1. A system to vary dimensions of a template having opposed surfaces with a side extending therebetween defining a perimeter surface, said system comprising:

first and second bodies, each of which has a contact member, defining a pair contact members, disposed opposite to each other and spaced apart a distance, with said first body including an actuator arm, and a chamber disposed adjacent to said actuator arm, with one of said pair of contact members being coupled to said actuator arm to move in response to movement of said actuator arm; and a bladder positioned within said chamber and having a variable volume, with said actuator arm coupled to said first body to move in response to variations of said volume to vary said distance.

2. The system as recited in claim 1 wherein one of said pair of contact members is formed from a compliant material.

3. The system as recited in claim 1 wherein said first body further includes an additional contact member, spaced apart an additional distance from said one of said pair of contact members, and an additional actuator arm, with said additional contact member being coupled to said additional actuator arm, with said bladder disposed within said chamber so that both said actuator arm and said additional actuator arm move in response to said variations of said volume to vary both said distance and said additional distance.

4. The system as recited in claim 1 further including an additional bladder, having an additional volume associated therewith, with said body further including an additional contact member, spaced apart from said one of said pair of contact members an additional distance, and an additional actuator arm, with said additional contact member being coupled to said additional actuator arm, with said additional bladder being disposed within said chamber so that said additional actuator arm moves in response to said variations of said additional volume to vary said additional distance independent of variations in said distance.

5. The system as recited in claim 1 wherein said actuator arm includes an actuator surface which said bladder contacts and said contact member includes a contact surface adapted to contacts said perimeter surface, with an area associated with said contact surface being less than an area associated with said actuator surface.

6. The system as recited in claim 1 wherein said actuator arm attached to said first body to reciprocate about an axis that lies in a plane spaced-apart from said template.

7. The system as recited in claim 1 further including a compression ring encompassing an area and having a circumferential surface facing said area, with said first and second bodies being coupled to said circumferential surface and opposite one another.

8. The system as recited in claim 1 wherein said bladder is positioned within said chamber to increase said distance in response to said volume increasing.

9. The system as recited in claim 1 wherein said bladder is positioned within said chamber to decrease said volume in response to said volume increasing.

10. The system as recited in claim 1 further including an additional bladder having an additional volume associated therewith, with said bladder and said additional bladder defining a bladder system, with said bladder being positioned within said chamber to increase said distance in response to said volume increasing and said additional bladder being positioned within said chamber to decrease said distance in response to said additional volume increasing.

11. A system to vary dimensions of a template having opposed surfaces with a side extending therebetween defining a perimeter surface, said system comprising:

first and second pairs of bodies each of which includes a contact member, with the contact members associated with said first pair of bodies defining a first pair of contact members and the contact members associated with said second pair of bodies defining a second pair of contact members, with the contact members of said first pair being disposed opposite each other and the contact members of said second pair beiiig disposed opposite each other, with one body of each of said first and second pairs of bodies including an actuator arm, and a chamber disposed adjacent to said actuator arm, with one of said pair of contact members being coupled to said actuator arm to move in response to movement of said actuator arm; and a bladder positioned within said chamber and having a variable volume, with said actuator arm coupled to said first body to move in response to variations of said volume to vary said distance.

12. The system as recited in claim 11 wherein said one body further includes an additional contact member, spaced apart an additional distance from said one of said pair of contact members, and an additional actuator arm, with said additional contact member being coupled to said additional actuator arm, with said bladder disposed within said chamber so that both said actuator arm and said additional actuator arm move in response to said variations of said volume to vary both said distance and said additional distance.

13. The system as recited in claim 12 further including an additional bladder, having an additional volume associated therewith, to contact said additional actuator arm, with said additional bladder being disposed within said chamber so that said additional actuator arm moves in response to said variations of said additional volume to vary said additional distance independent of variations in said distance.

14. The system as recited in claim 13 wherein one of said contact members of each of said first and second pairs is formed from compliant material.

15. The system as recited in claim 11 wherein said actuator arm includes an actuator surface which said bladder contacts and said contact member includes a contact surface adapted to contacts said perimeter surface, with an area associated with said contact surface being less than an area associated with said actuator surface.

16. The system as recited in claim 11 wherein said actuator arm attached to said first body to reciprocate about an axis that lies in a plane spaced-apart from said template.

17. The system as recited in claim 11 further including a compression ring encompassing an area and having a circumferential surface facing said area, said first and second pairs of bodies being coupled to said circumferential surface, with the bodies associated with said first pair being positioned opposite one another, with the bodies associated with said first pair being positioned opposite one another.

18. A system to varying dimensions of a template having opposed surfaces with a side extending therebetween defining a perimeter surface, said system comprising:

a compression device including a pair of spaced-apart contact members, to compress said perimeter surface between said pair of spaced-apart contact members, with one of said pair of spaced-apart contact members being formed from a material to comply with a shape of said perimeter surface, wherein said compression device further includes first and second bodies, each of which has a contact member, defining a pair contact members, disposed opposite to each other and spaced apart a distance, with said first body including an actuator arm, and a chamber disposed adjacent to said actuator arm, with one of said pair of contact members being coupled to said actuator arm to move in response to movement of said actuator arm and a bladder positioned within said chamber and having a variable volume, with said actuator arm coupled to said first body to move in response to variations of said volume to vary said distance.

19. The system as recited in claim 18 wherein said compression device further includes a generator to create a force to cause said perimeter surface to be compressed between said contact members and a force amplifier to increase an amount of said force per unit area on said one of said pair of contact members.

20. The system as recited in claim 18 wherein said actuator arm includes an actuator surface which said bladder contacts and said contact member includes a contact surface adapted to contact said perimeter surface, with an area associated with said contact surface being less than an area associated with said actuator surface.

21. The system as recited in claim 18 wherein said actuator arm attached to said first body to reciprocate about an axis that lies in a plane spaced-apart from said template.

22. The system as recited in claim 18 further including a compression ring encompassing an area and having a circumferential surface facing said area, with said first and second bodies being coupled to said circumferential surface and opposite one another.

* * * * *